United States Patent
Chi et al.

(10) Patent No.: US 8,952,548 B2
(45) Date of Patent: Feb. 10, 2015

(54) APPARATUS AND METHOD FOR INCREASING BANDWIDTHS OF STACKED DIES

(75) Inventors: Shyh-An Chi, Hsin-Chu (TW); Mark Shane Peng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 877 days.

(21) Appl. No.: 13/077,654

(22) Filed: Mar. 31, 2011

(65) Prior Publication Data
US 2012/0250286 A1 Oct. 4, 2012

(51) Int. Cl.
*H01L 23/48* (2006.01)
*H01L 25/065* (2006.01)

(52) U.S. Cl.
CPC ........ *H01L 25/0652* (2013.01); *H01L 25/0657* (2013.01); *H01L 2225/0652* (2013.01); *H01L 2225/06572* (2013.01); *H01L 2225/06548* (2013.01); *H01L 2224/16145* (2013.01)
USPC ...................................................... 257/777

(58) Field of Classification Search
CPC .......... H01L 2924/01079; H01L 2924/15311; H01L 25/0657; H01L 25/105; H01L 2224/48091
USPC ......... 257/685–686, 688, 693, 777, 775, 778, 257/785, 786, 774
See application file for complete search history.

(56) References Cited

U.S. PATENT DOCUMENTS

| | | | |
|---|---|---|---|
| 7,111,149 B2 | 9/2006 | Eilert | |
| 7,772,708 B2 | 8/2010 | Leddige et al. | |
| 7,830,692 B2 | 11/2010 | Chung et al. | |
| 7,834,450 B2 | 11/2010 | Kang | |
| 8,198,717 B1 * | 6/2012 | Schenck et al. | 257/686 |
| 2006/0126369 A1 | 6/2006 | Raghuram | |
| 2009/0039492 A1 | 2/2009 | Kang et al. | |
| 2010/0008058 A1 | 1/2010 | Saen et al. | |
| 2010/0232201 A1 | 9/2010 | Ikeda et al. | |

FOREIGN PATENT DOCUMENTS

| | | |
|---|---|---|
| CN | 1832165 | 9/2006 |
| CN | 101577268 | 11/2009 |

OTHER PUBLICATIONS

Kang, U., et al., "8Gb 3D DDR3 DRAM Using Through-Silicon-Via Technology," 2009 IEEE International Solid-State Circuits Conference, Session 7, Feb. 10, 2009, 3 pgs.

* cited by examiner

*Primary Examiner* — Hoa B Trinh
(74) *Attorney, Agent, or Firm* — Slater & Matsil, L.L.P.

(57) ABSTRACT

A package structure includes a plurality of die carriers identical to each other. The respective features in each of the plurality of die carriers vertically overlap corresponding features in other ones of the plurality of die carriers. Each of the plurality of die carriers includes a plurality of through-substrate vias (TSVs) including a plurality of data buses. The plurality of die carriers is stacked and electrically connected to each other through the plurality of TSVs. The package structure further includes a plurality of device dies. Each of the plurality of device dies is bonded to one of the plurality of die carriers. Each of the plurality of data buses is configured to dedicate to data transmission of one of the plurality of device dies.

20 Claims, 15 Drawing Sheets

US 8,952,548 B2

APPARATUS AND METHOD FOR INCREASING BANDWIDTHS OF STACKED DIES

BACKGROUND

To increase the data storage capacity and the bandwidth, dies are stacked. The stacked dies also have the advantageous features of reduced packaging areas. Typically, through-substrate vias (TSVs) are used to transfer the data between stacked dies.

There is a trade-off between the data bandwidth and the amount of TSVs fabricated in each of the stacked dies. With the more demanding requirement in the data storage capacity and the bandwidth, more TSVs need to be formed in the dies. However, increasing the number of TSVs requires the sizes of the stacked dies to be increased, and the stacked dies need to be more customized for a specific package structure. Accordingly, the stacked dies are not reusable for other package structures. This posts a limitation to the total number of TSVs, which in turn results in the limitation in the data bandwidth of the package structures.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A package structure including stacked dies and the method of forming the same are provided in accordance with an embodiment. The variations and the operation of the embodiment are then discussed. Throughout the various views and illustrative embodiments, like reference numbers are used to designate like elements.

Figure 1:
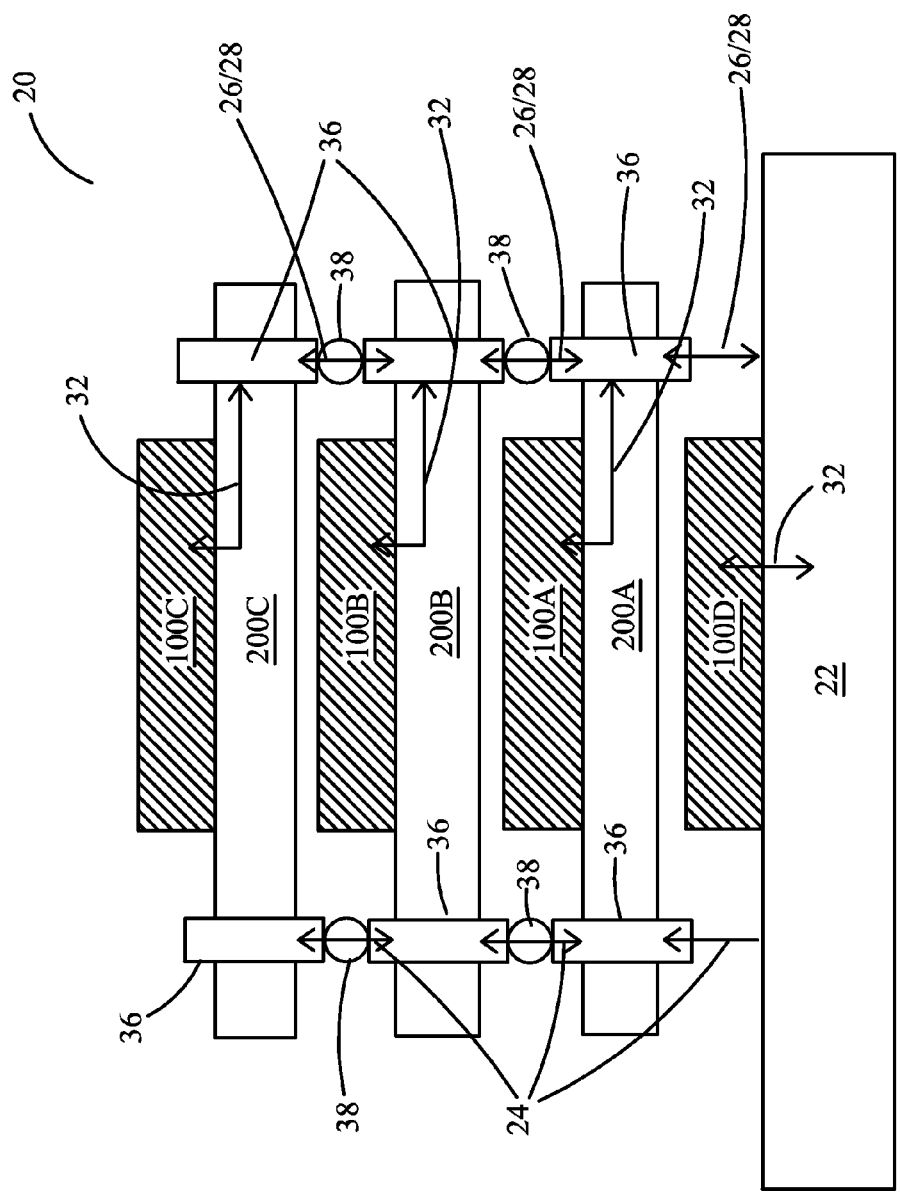
FIGS. 1, 2, and 3 illustrate a cross-sectional view, a top view, and a perspective view of a package structure in accordance with various embodiments.

FIG. 1 illustrates a cross-sectional view of package structure 20, which includes interposer 22, die carriers 200 (including 200A, 200B, and 200C), device dies 100 (including 100A, 100B, 100C, and 100D), carrier ID lines 24, address and control lines 26 (referred to as address/control lines hereinafter), and data buses 28. Device dies 100A, 100B, and 100C are bonded to die carriers 200A, 200B, and 200C, respectively, for example, through flip chip bonding or wire bonding. Device die 100D may be bonded onto interposer 22 directly. Through electrical connections 32, which may be metal lines in die carriers 200, data may be transferred between device dies 100 and address/control lines 26 and data buses 28.

Device dies 100A, 100B, 100C, and 100D may be memory dies or other types of dies, and may be identical to each other. Die carriers 200A, 200B, and 200C may be identical to each other, and may be identical to or different from interposer 22. In an embodiment, in a top view of package structure 20, die carriers 200A, 200B, and 200C are placed in the same orientation, and are neither rotated nor flipped relative to each other, so that the respective features 24, 26, 32, and 36 in one of die carriers 200 are vertically aligned to the corresponding features in other die carriers 200. In an embodiment, device dies 100 do not include through-substrate vias (TSVs) therein. Die carriers 200, however, include TSVs 36 therein, which are used for the interconnection of carrier ID lines 24, address/control lines 26, and data buses 28. TSVs 36 also form parts of carrier ID lines 24, address/control lines 26, and data buses 28. Throughout the description, in the cross-sectional view, one illustrated TSV 36 in each of die carriers 200 may actually represent a plurality of TSVs. In an embodiment, TSVs 36 in neighboring die carriers 200 may be connected through solder bumps 38. Throughout the description, TSVs 36 and/or solder bumps 38 are also referred to as connecting elements, which are used for connecting adjacent die carriers 200. TSVs 36 may, or may not, be formed as metal posts that protrude beyond the surfaces of die carriers 200, and TSVs 36 in neighboring die carriers 200 are bonded to each other directly or through solder bumps 38. The space between neighboring die carriers 200 are large enough for placing device dies 100.

Figure 2:
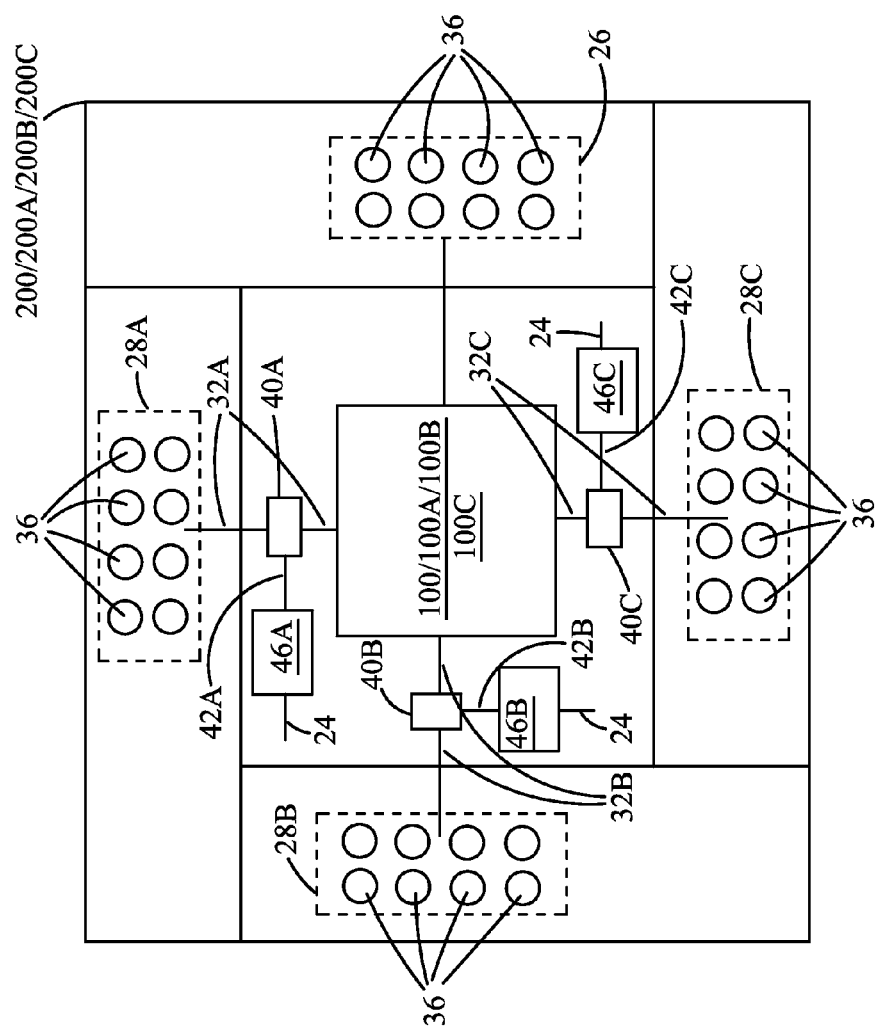

FIG. 2 illustrates a top view of one of die carriers 200 (which may be any of die carrier 200A, 200B, and 200C) and the respective dies 100 (which may be any of die carrier 100A, 100B, and 100C) bonded to the illustrated die carrier 200. In an embodiment, a plurality of TSVs 36 forms data bus 28A, which is dedicated to the data transmission of device die 100A, and hence is not used for the data transmission of any other device die including device dies 100B, 100C, and 100D. Similarly, data buses 28B and 28C are dedicated to the data transmission of device dies 100B and 100C, respectively, and are not used for the data transmission of other device dies. Connections 32 (including 32A, 32B, and 32C), which may be formed of metal lines and vias, may be controlled by transmission gates 40 (including 40A, 40B, and 40C). The control inputs 42 (including 42A, 42B, and 42C) of transmission gates 40 receive enablement signals from enablement signal generation circuits 46 (including 46A, 46B, and 46C), which further receive input signals from die carrier ID lines 24 (not shown in FIG. 1, please refer to FIG. 4). Transmission gates 40 may be turned on when the enablement signals are "1," and turned off when the enablement signals are "0." Furthermore, a plurality of TSVs 36 forms address/control lines 26, which are also connected to device dies 100.

Connections 32 in different die carriers 200 may be identical to each other. Alternatively stating, stacking one layer of device die and die carrier (such as device die 100B and die carrier 200B) may be a mere repetition of the stacking of an underlying layer of device die and die carrier (such as device die 100A and die carrier 200A) with no modification of connections 32 needed.

Figure 3:
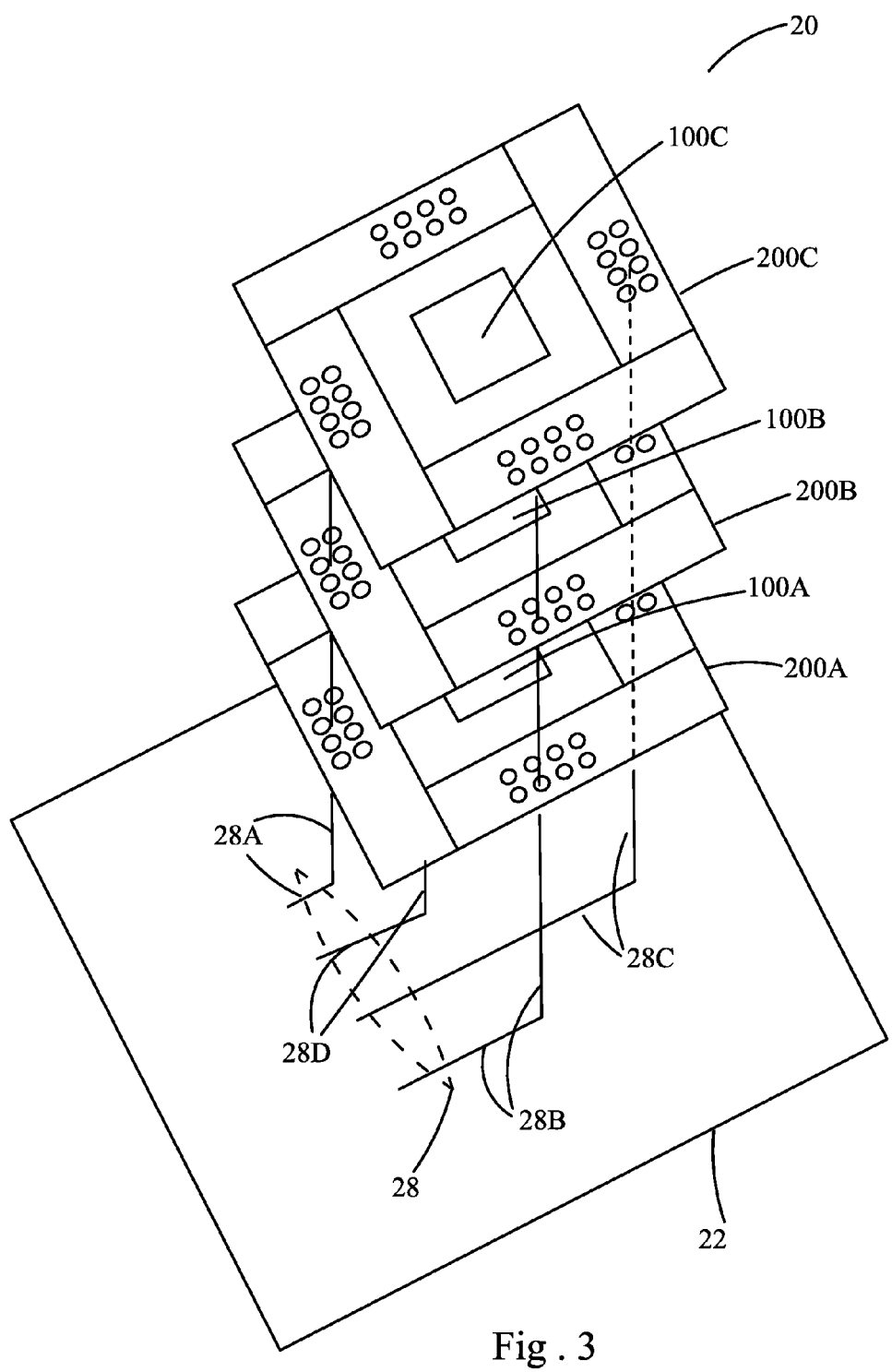

FIG. 3 illustrates a schematic perspective view of portions of package structure 20, wherein each group of data buses 28 (including 28A through 28D) is schematically illustrated using a line, although each of the lines actually contains multiple lines and/or TSVs. Since each of data buses 28A, 28B, 28C, and 28D (data bus 28D is connected to device die 100D as in FIG. 1) is dedicated to one of device dies 100, device dies 100A, 100B, and 100C, and 100D may be read simultaneously or written into simultaneously. The bandwidth of data buses 28 on interposer 22 is thus increased to four times the bandwidth of each of data buses 28A, 28B, 28C, and 28D.

Figure 4:
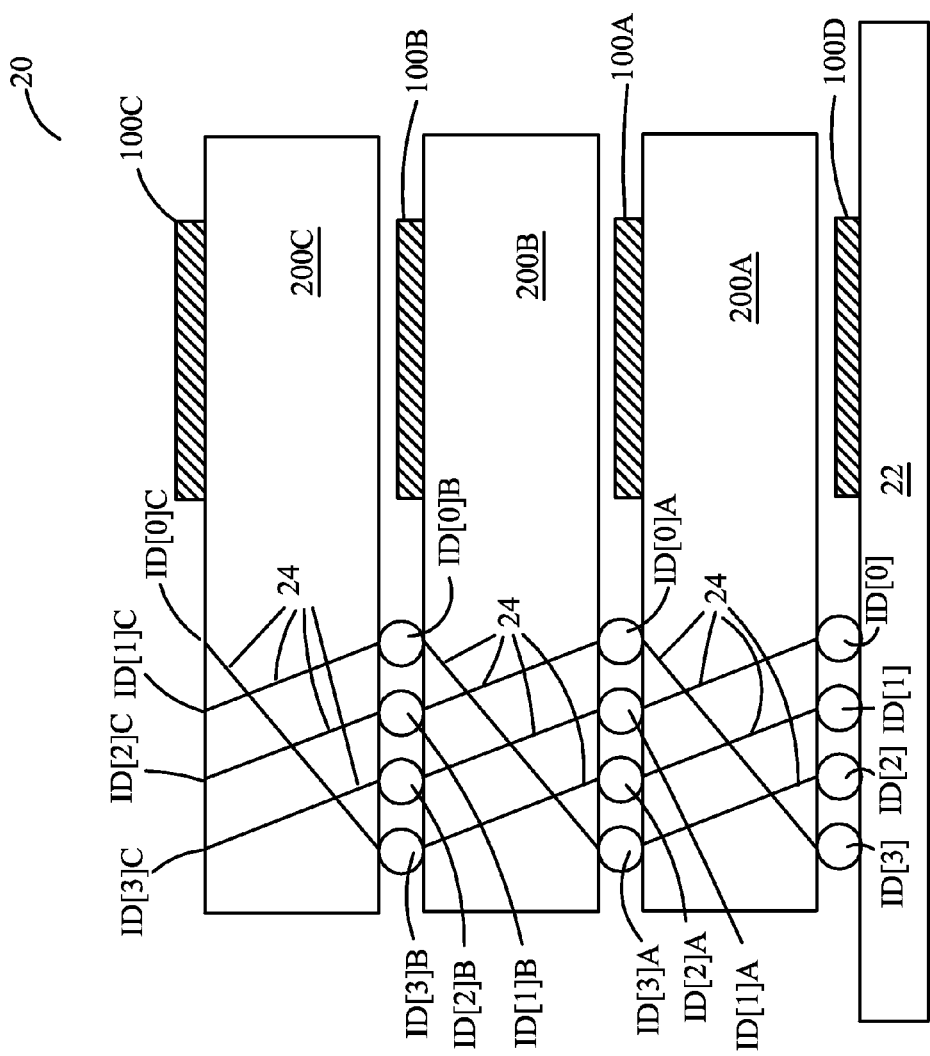
FIG. 4 illustrates a cross-sectional view of the package structure, wherein exemplary die carrier ID lines are illustrated.
Figure 5:
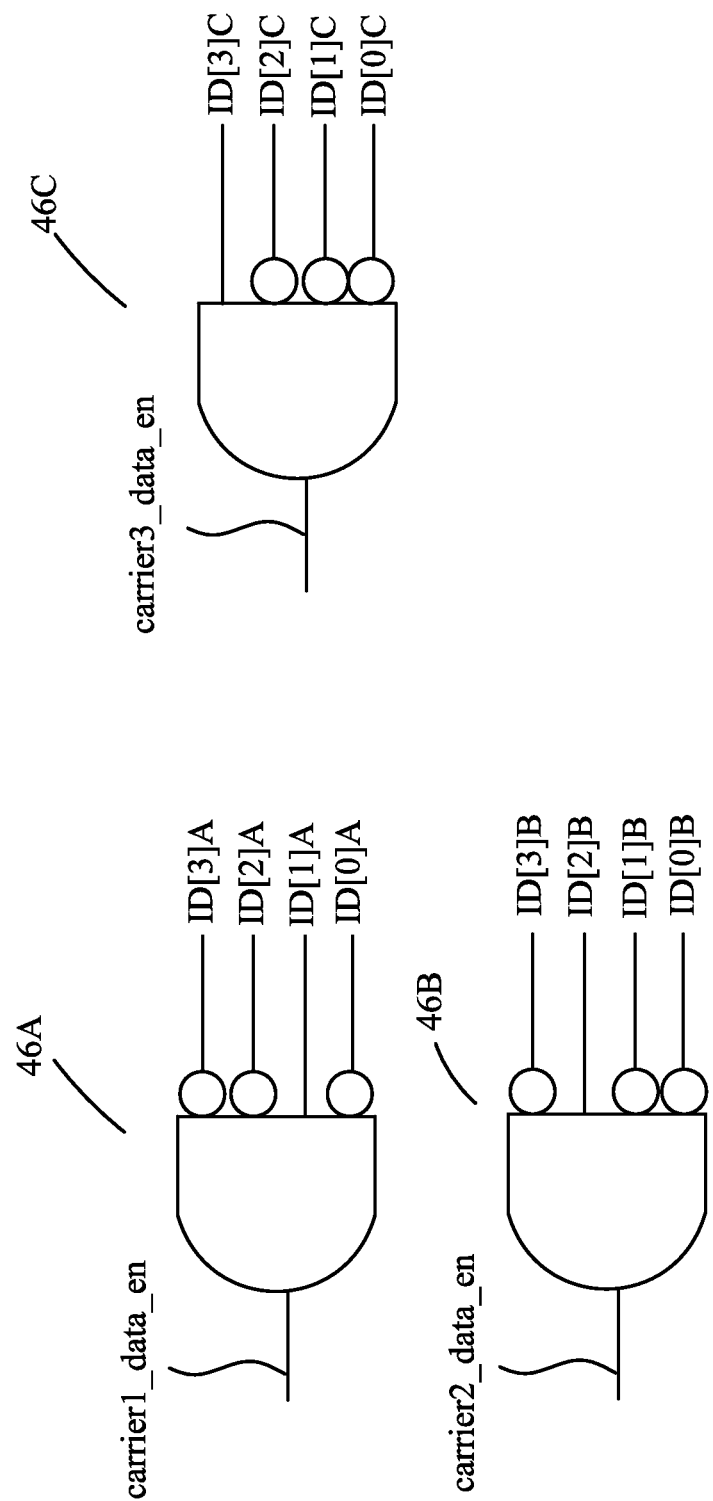
FIG. 5 illustrates enablement signal generation circuits, which generate enablement signals from the signals on die carrier ID lines.

FIGS. 4 and 5 illustrate an exemplary embodiment for generating enablement signals for controlling transmission gates 40 in FIG. 2, wherein the enablement signals are generated using die carrier IDs of die carriers 200. The bits of each of die carriers 200A, 200B, and 200C include ID[3], ID[2], ID[1], and ID[0], wherein postfixes "A" "B" and "C" are added to indicate the die carriers the IDs belonging to. In the illustrated exemplary embodiment, device ID lines 24 may be connected in a rotated way, and hence the die carrier IDs of interposer 22 and die carriers 200A, 200B, and 200C are also rotated one bit to the left compared to that of the respective underlying die carriers. Please note that interposer 22 may also has a die carrier ID. When interposer 22 has die carrier ID [0001], die carriers 200A, 200B, and 200C have die carrier ID [0010], [0100], and [1000], respectively. In alternative embodiments, the rotation of die carrier IDs may be a right rotation rather than a left rotation. In yet other embodiments, the construction of the die carrier IDs of overlying die carriers based on the die carrier IDs of underlying die carriers may use other methods. For example, each of the die carrier IDs of a die carrier may be the die carrier ID of the underlying die carrier plus 1. It is noted that although four ID lines 24 are illustrated, ID lines 24 may include more, such as 8 or 16, lines, so that if more layers of die carriers and device dies are stacked, the design of die carriers 200 do not need to be changed.

FIG. 5 illustrates exemplary enablement signal generation circuits 46 (including 46A, 46B, and 46C) for generating the enablement signals, which are used for enabling the data transmission for a specific device die 100. Enablement signals carrier1_data_en, carrier2_data_en, and carrier3_data_en are connected to nodes 42A, 42B, and 42C, respectively (refer to FIG. 2), and are used to enable die carrier 200A/die 100A, die carrier 200B/die 100B, and die carrier 200C/die 100C, respectively. In an embodiment, enablement signal generation circuits 46 comprise "AND" gates. If the die carrier ID of interposer 22 is [0001], the logic of the enablement signals may be expressed as:

$$\text{carrier1\_data\_en}=\sim\text{ID}[3] \text{ AND} \sim\text{ID}[2] \text{ AND ID}[1] \text{ AND} \sim\text{ID}[0] \quad [\text{Eq. 1}]$$

$$\text{carrier2\_data\_en}=\sim\text{ID}[3] \text{ AND} \sim\text{ID}[2] \text{ AND} \sim\text{ID}[1] \text{ AND} \sim\text{ID}[0] \quad [\text{Eq. 2}]$$

$$\text{carrier3\_data\_en}=\text{ID}[3] \text{ AND} \sim\text{ID}[2] \text{ AND} \sim\text{ID}[1] \text{ AND} \sim\text{ID}[0] \quad [\text{Eq. 3}]$$

The circuit for generating enablement signals such as "AND" gates 46 may be built in die carriers 200. It is observed that for die carrier 200A, carrier1_data_en is "1," while carrier2_data_en and carrier3_data_en are "0." For die carrier 200B, carrier2_data_en is "1," while carrier1_data_en and carrier3_data_en are "0." For die carrier 200C, carrier3_data_en is "1," while carrier1_data_en and carrier2_data_en are "0." Accordingly, referring to FIG. 2, it is observed that each of data buses 28A, 28B, and 28C is dedicated to the data transmission by device dies 100A, 100B, and 100C, respectively. Further, data bus 28D in FIG. 3 is used by device 100D, and not by device dies 100A, 100B, and 100C. Dedicated data transmission is thus achieved.

Figure 6:
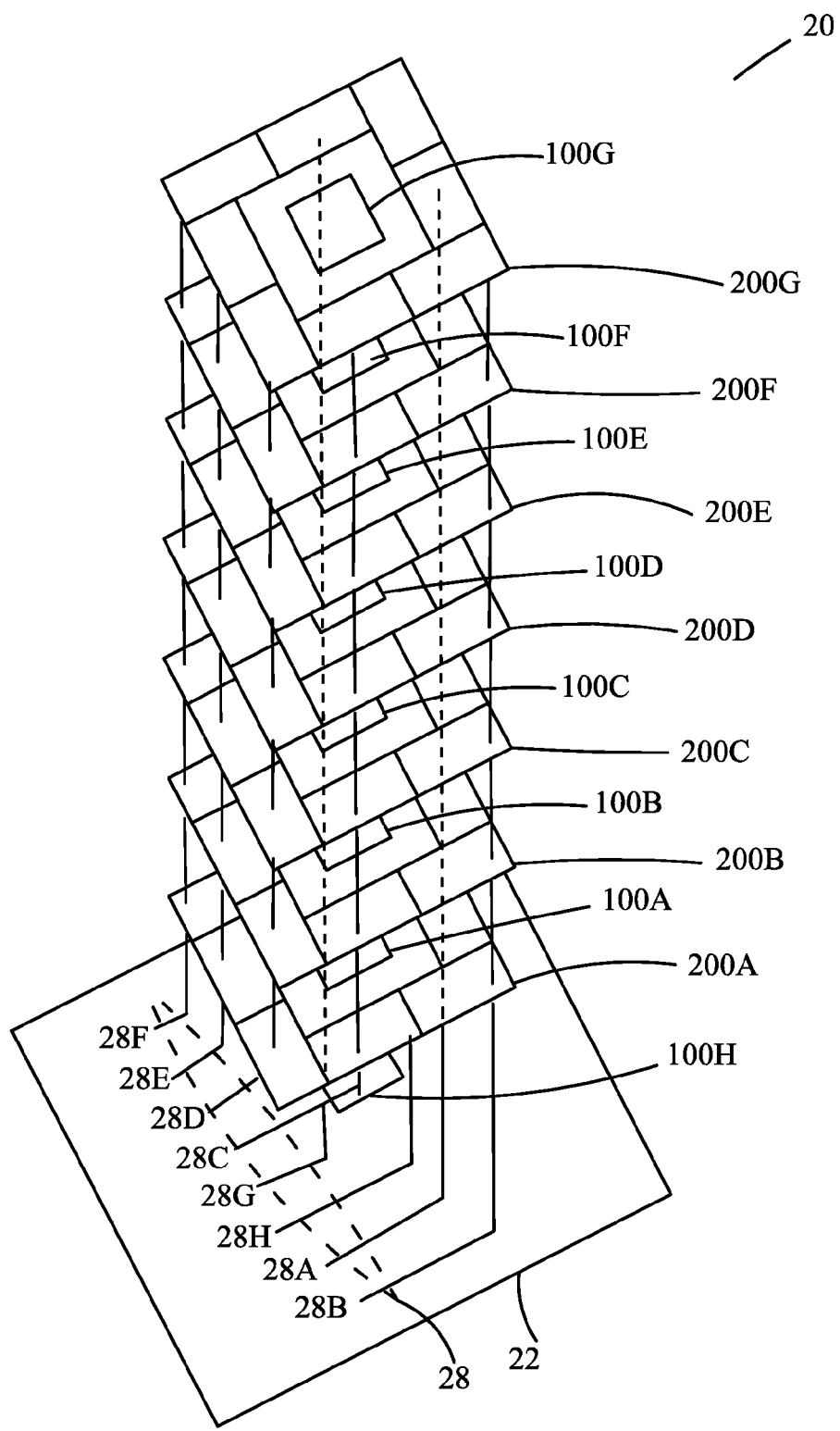
FIGS. 6 and 7 illustrate a perspective view and a top view, respectively, of a package structure in accordance with various alternative embodiments, wherein eight device dies are stacked.
Figure 7:
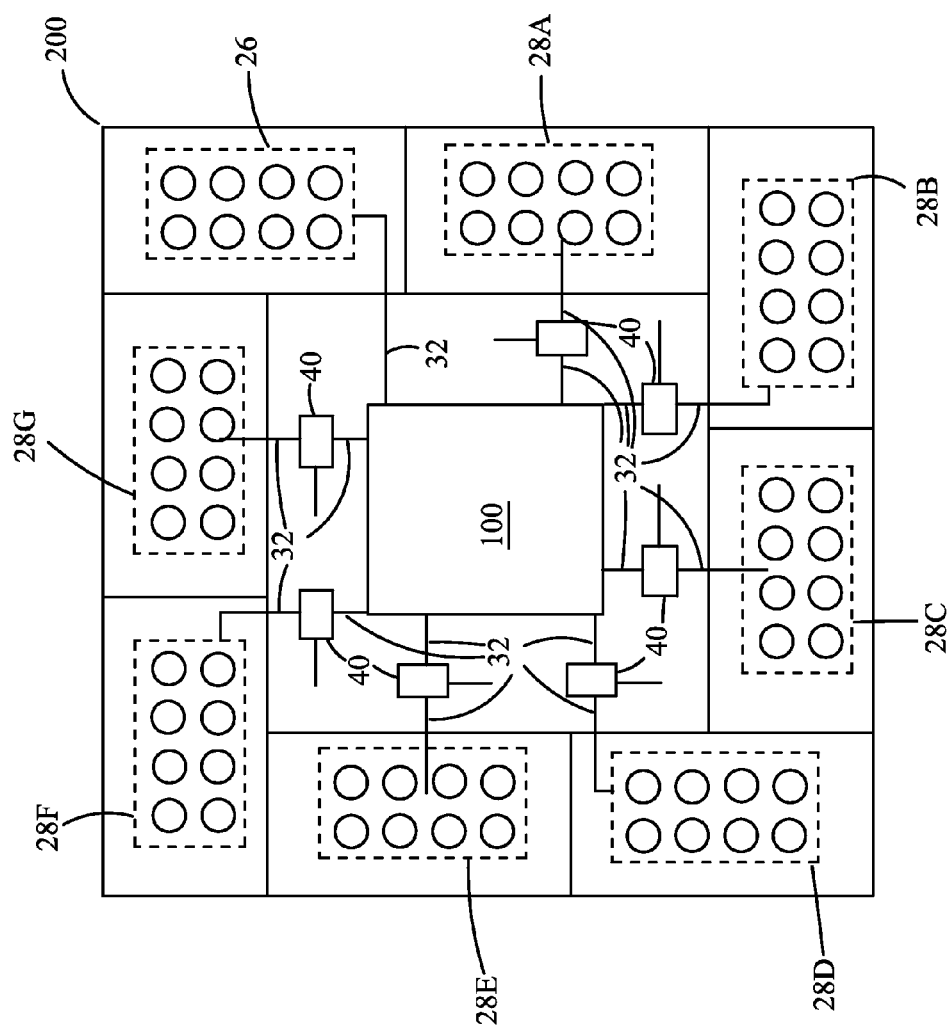

FIGS. 6 and 7 illustrate a package structure in accordance with alternative embodiments. Unless specified otherwise, the reference numerals in subsequent alternative embodiments represent like elements in the embodiments illustrated in FIGS. 1 through 5. Furthermore, for the simplicity of discussion, not all features in FIGS. 1 through 5 such as 24, 26, 36, 40, 46, and the like are illustrated in the alternative embodiments. The discussion of these un-shown features may also be skipped. However, these elements may also exist whenever applicable, and the details of these features may also be found in the description of the embodiments as shown in FIGS. 1 through 5.

FIG. 6 illustrates a schematic perspective view, wherein seven die carriers 200A through 200G and eight device dies 100A through 100H are stacked. Device die 100H may be bonded onto interposer 22 directly, while each of device dies 100A through 100G is bonded to the respective one of die carriers 200A through 200G. There are eight buses 28A through 28H, each dedicated to the data transmission of one of device dies 100A through 100H. Carrier ID lines 24 (not shown, please refer to FIG. 4) may adopt the similar scheme as shown in FIGS. 4 and 5 (except there may be eight or more carrier ID lines) to generate appropriate enablement signals for each of carriers 200 and devices dies 100. The enablement signals are provided to control the transmission gates 40 as in FIG. 7. Similarly, device dies 100A through 100H may be identical to each other, and die carriers 200A through 200G may be identical to each other. Also, die carriers 200A through 200G are aligned, and are neither rotated nor flipped relative to others.

FIG. 7 illustrates a top view of each of die carrier 200 and the respective device die 100. Electrical connections 32 connect die 100 to address/control lines 26 and seven groups of data buses 28 (including 28A through 28G). Through the control of enablement signals of transmission gates 40, data buses 28A through 28H (also refer to FIG. 6) are dedicated to the data transmission of the respective device dies 100A through 100H. Since each of the illustrated device dies 100 has an electrical connection to each of data buses 28A through 28G, die carriers 200 can be identical to each. In this embodiment, since there are eight dedicated data buses 28 (28A through 28H), the bandwidth is increased to eight times the bandwidth of each of data buses 28.

Figure 8:
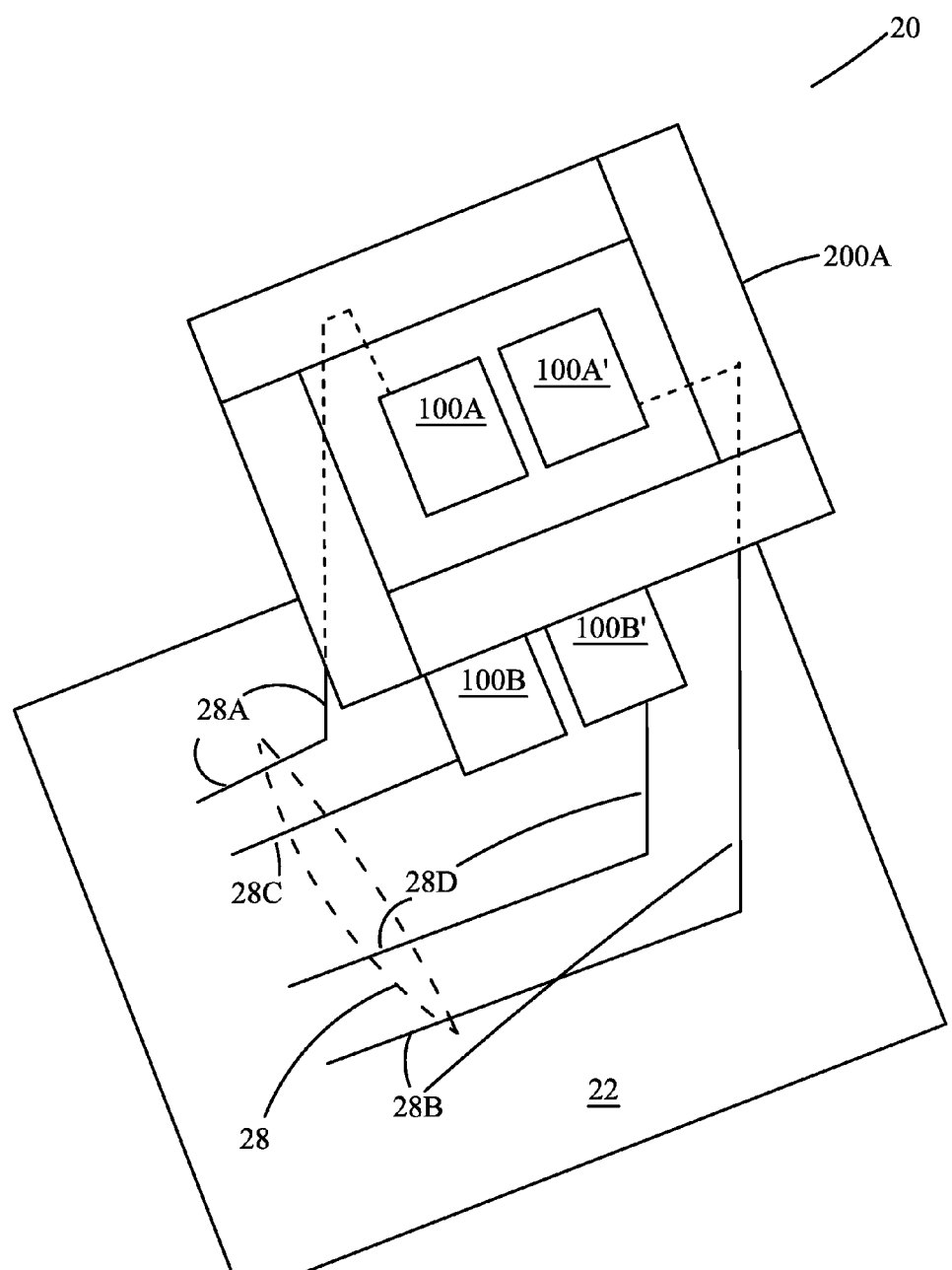
FIGS. 8 and 9 illustrate a perspective view and a top view, respectively, of a package structure in accordance with various alternative embodiments, wherein two device dies are bonded to a same side of a same die carrier.
Figure 9:
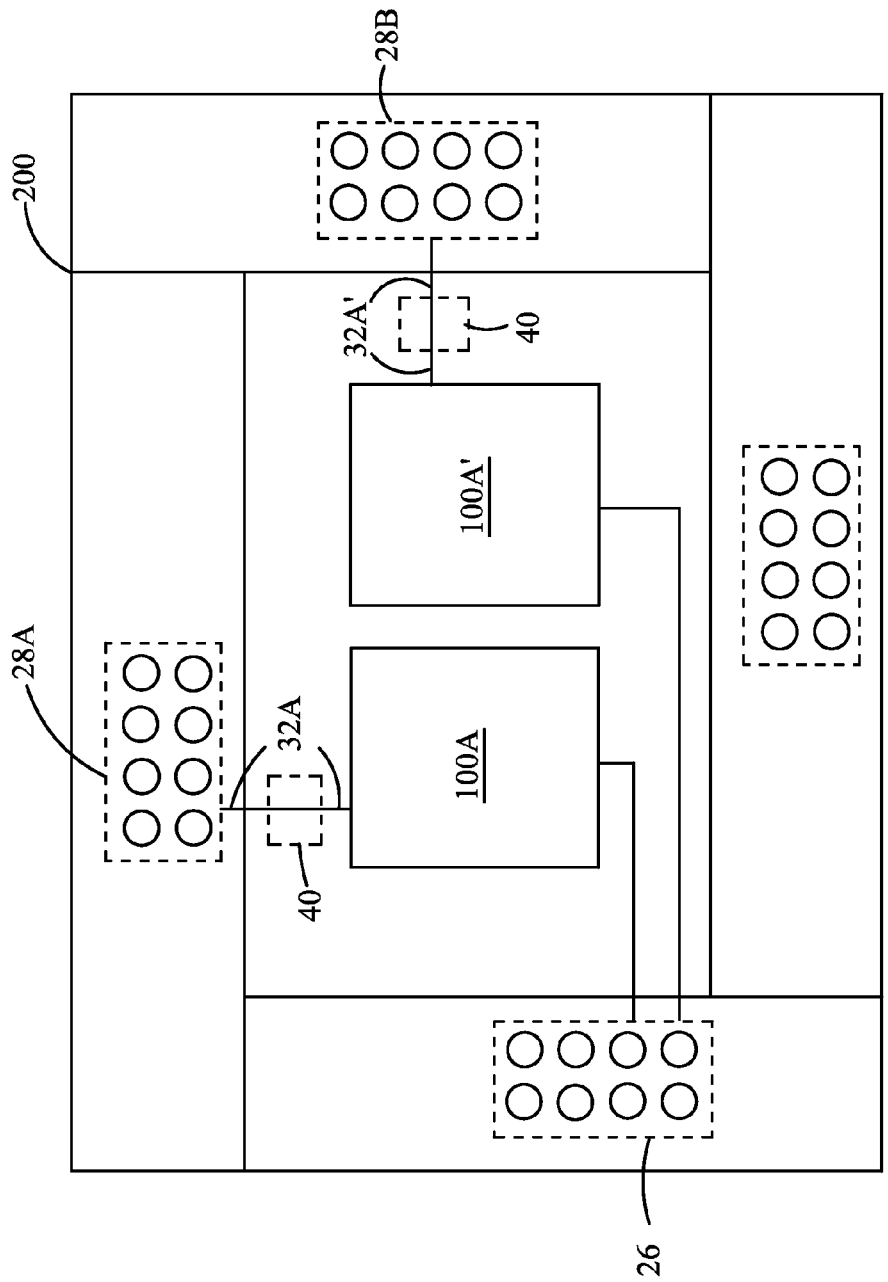

FIGS. 8 and 9 illustrate a package structure in accordance with yet other embodiments. FIG. 8 illustrates a schematic perspective view, wherein four device dies 100 (including 100A, 100A', 100B, and 100B') are stacked. Device dies 100B and 100B' may be bonded onto interposer 22 directly, while device dies 100A and 100A' are bonded on die carrier 200A. There are four buses 28A through 28D, each dedicated to the data transmission of one of device dies 100. In this embodiment, since there are four dedicated data buses 28 (28A through 28D), the bandwidth is increased to four times the bandwidth of each of data buses 28. Similarly, device dies 100A through 100B' may be identical.

FIG. 9 illustrates a top view of die carrier 200A and the respective device dies 100A and 100A'. The electrical connections 32 include two groups, namely 32A through 32A'. In the embodiment wherein only one level of die carrier 200 is bonded to interposer 22, transmission gates 40 may be omitted. However, to improve the expandability, transmission gates 40 may be added, so that more levels of die carriers 200 and device dies 100 may be stacked.

Figure 10:
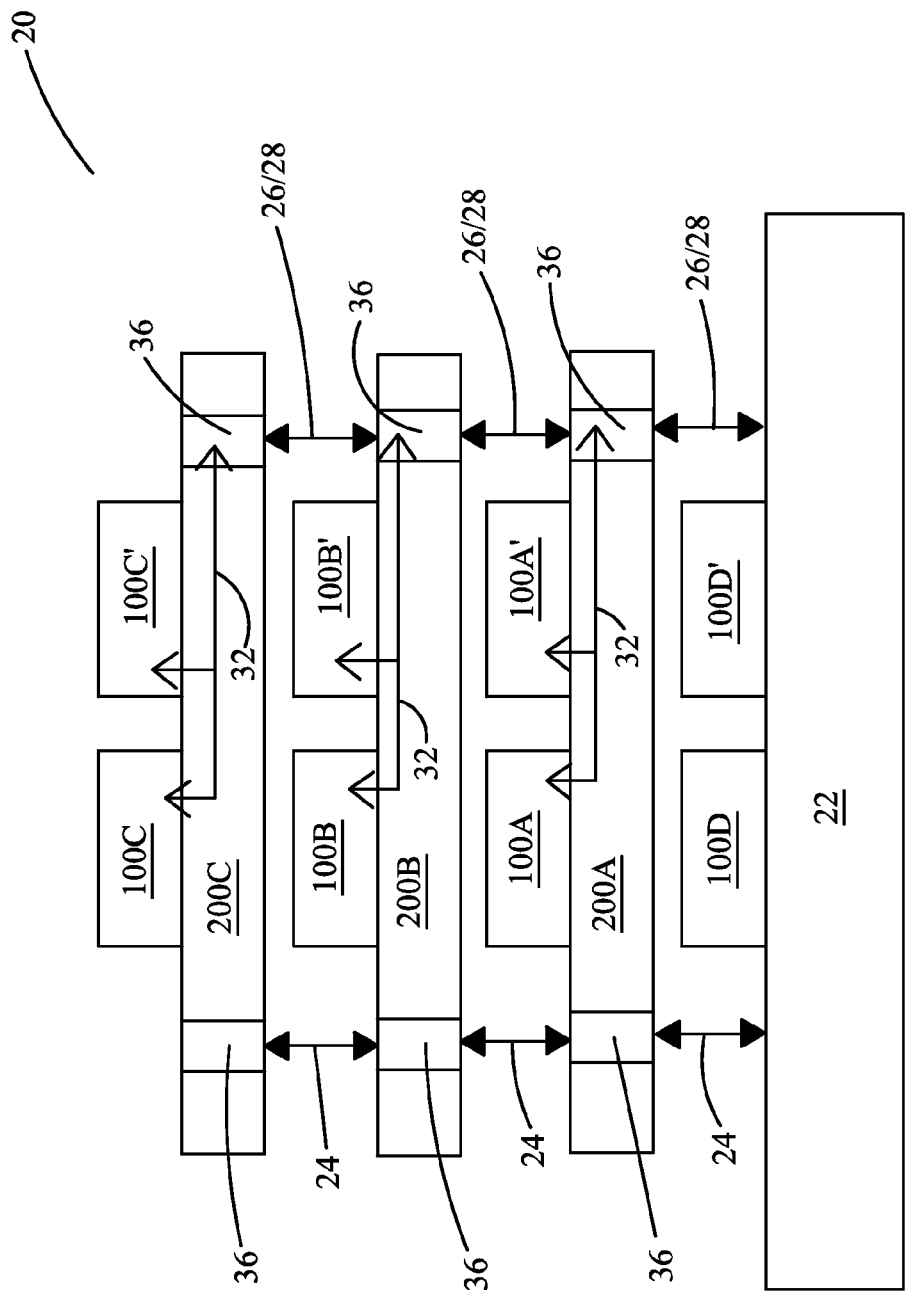
FIGS. 10, 11, and 12 illustrate a cross-sectional view, a perspective view, and a top view, respectively, of a package structure in accordance with various alternative embodiments, wherein two device dies are bonded to a same side of a same die carrier, and wherein eight device dies are stacked.
Figure 11:
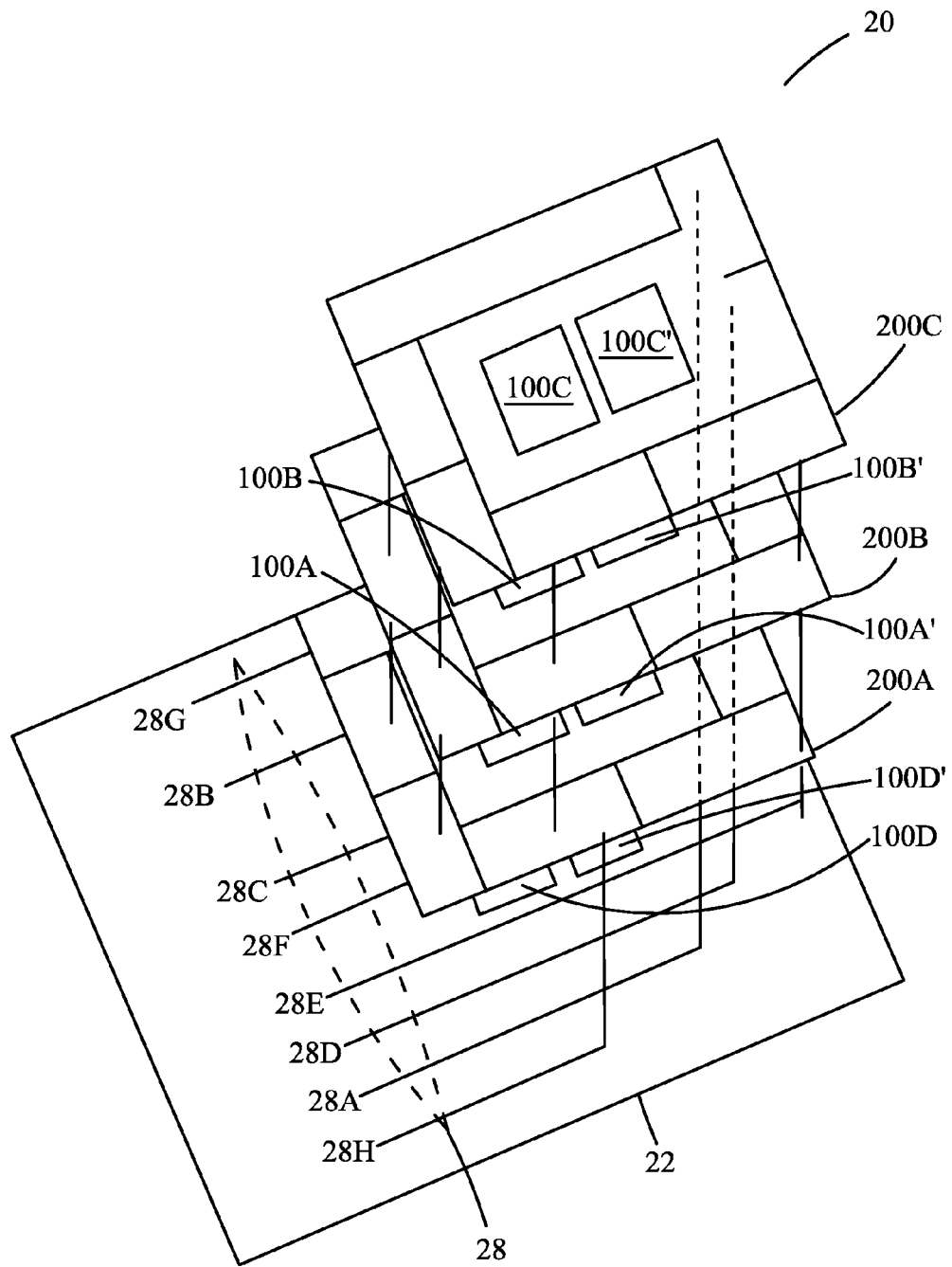
Figure 12:
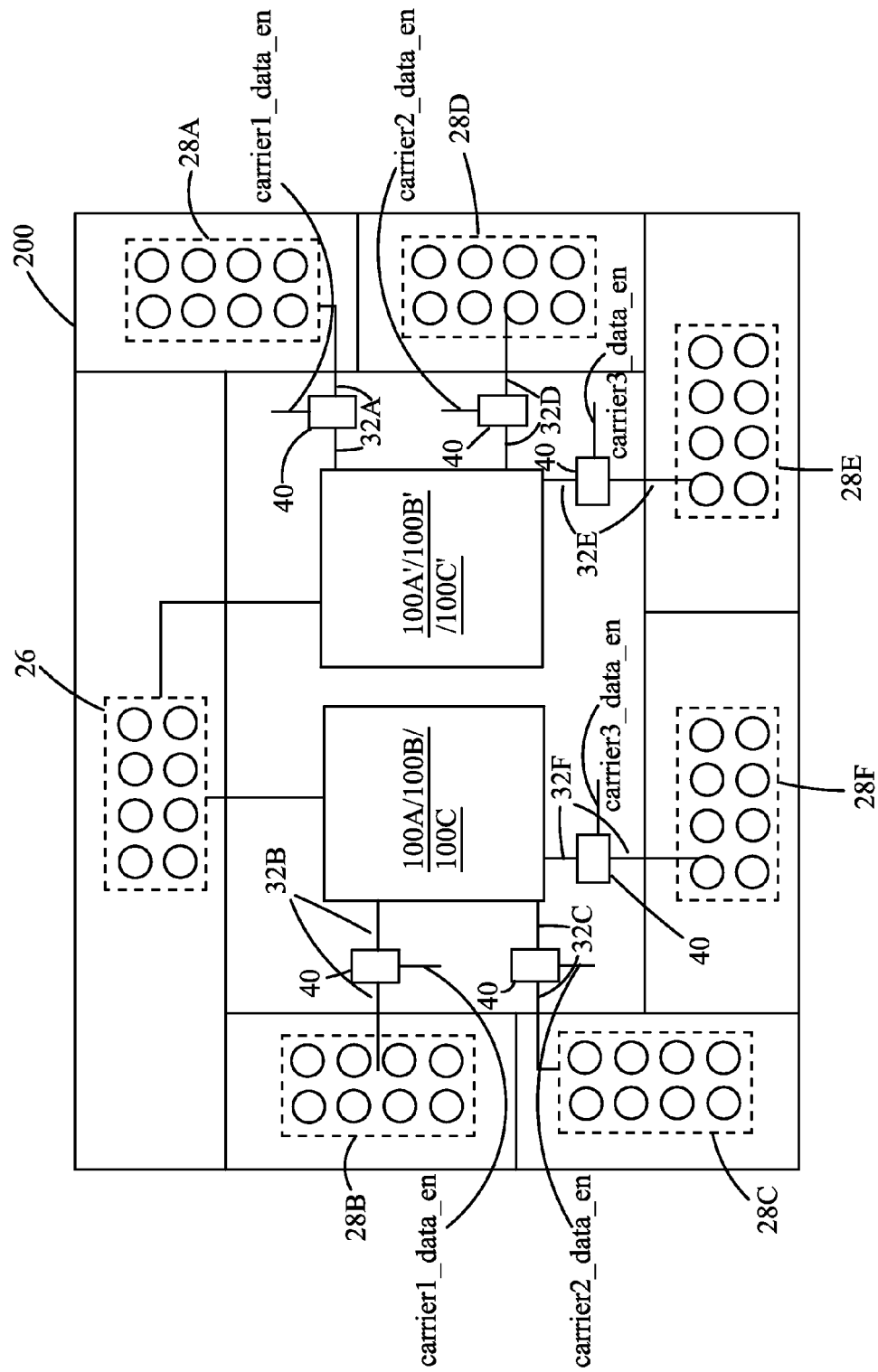

FIGS. 10 through 12 illustrate a package structure in accordance with yet other embodiments. FIG. 10 is a cross-sectional view, which shows that eight device dies 100 (including 100A, 100A', 100B, 100B', 100C, 100C', 100D, and 100D') are stacked through die carriers 200 (including 200A, 200B, and 200C). Furthermore, interposer 22 is bonded to the stacked dies, with device dies 100D and 100D' bonded on interposer 22 directly. FIG. 11 illustrates a schematic perspective view. There are eight buses 28 (28A through 28H), each dedicated to the data transmission of one of device dies 100A through 100D'. In this embodiment, since there are eight dedicated data buses 28, the bandwidth is increased to eight times the bandwidth of a single one of data buses 28. Similarly, device dies 100A through 100D may be identical, and die carriers 200A through 200C may be identical, and are neither rotated nor flipped relative to each other.

FIG. 12 illustrates a top view of each of die carrier 200 (200A, 200B, or 200C) and the respective device dies 100 bonded to the illustrated die carrier 200. The electrical connections 32 (including 32A through 32F) connect the respective device dies 100 to data buses 28 (including 28A through 28F), and to address/control lines 26. It is observed that since electrical connection 32A and 32B are separate from each other, and are not connected to the same device die 100, they can be controlled using the same enablement signal carrier1_data_en. Similarly, electrical connections 32C and 32D may be controlled using the same enablement signal carrier2_data_en, and electrical connections 32E and 32F may be controlled using the same enablement signal carrier3_data_en. Through the control of transmission gates 40 using enablement signals, data buses 28A through 28F are dedicated to the respective device dies 100A through 100C. Die carriers 200 may be identical to each other. Furthermore, die carriers 200 may be identical to each other, and aligned to each other without rotated or flipped relative to each other. Carrier ID lines 24 (not shown, please refer to FIGS. 1 and 4) may adopt the similar scheme as shown in FIGS. 4 and 5 to generate appropriate enablement signals for each of carriers 200. The enablement signals are provided to the control inputs of transmission gates 40 in FIG. 12.

Figure 13:
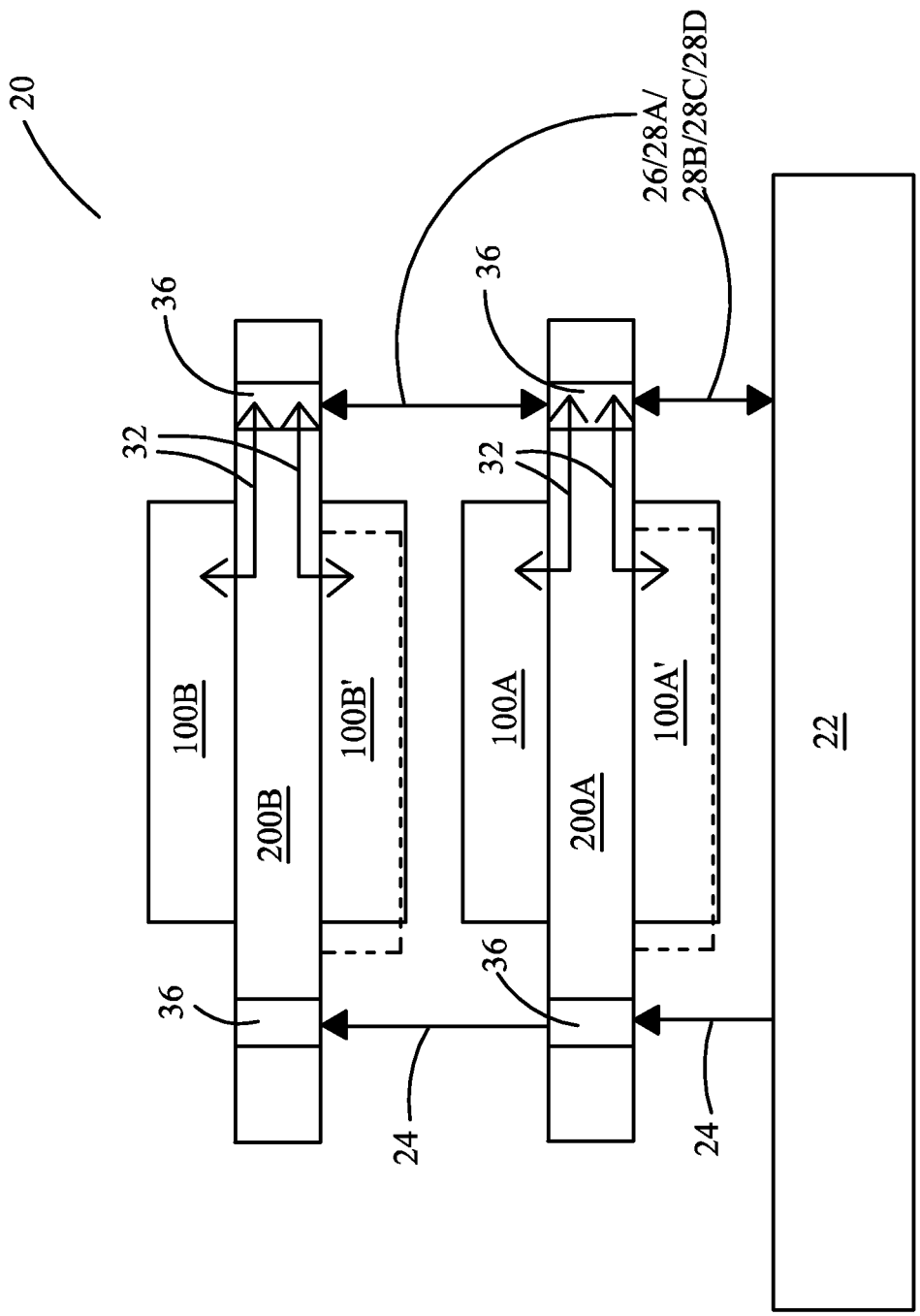
FIGS. 13, 14, and 15 illustrate a cross-sectional view, a top view, and a bottom view, respectively, of a package structure in accordance with various alternative embodiments, wherein two device dies are bonded to opposite sides of a same die carrier, and eight device dies are stacked.
Figure 14:
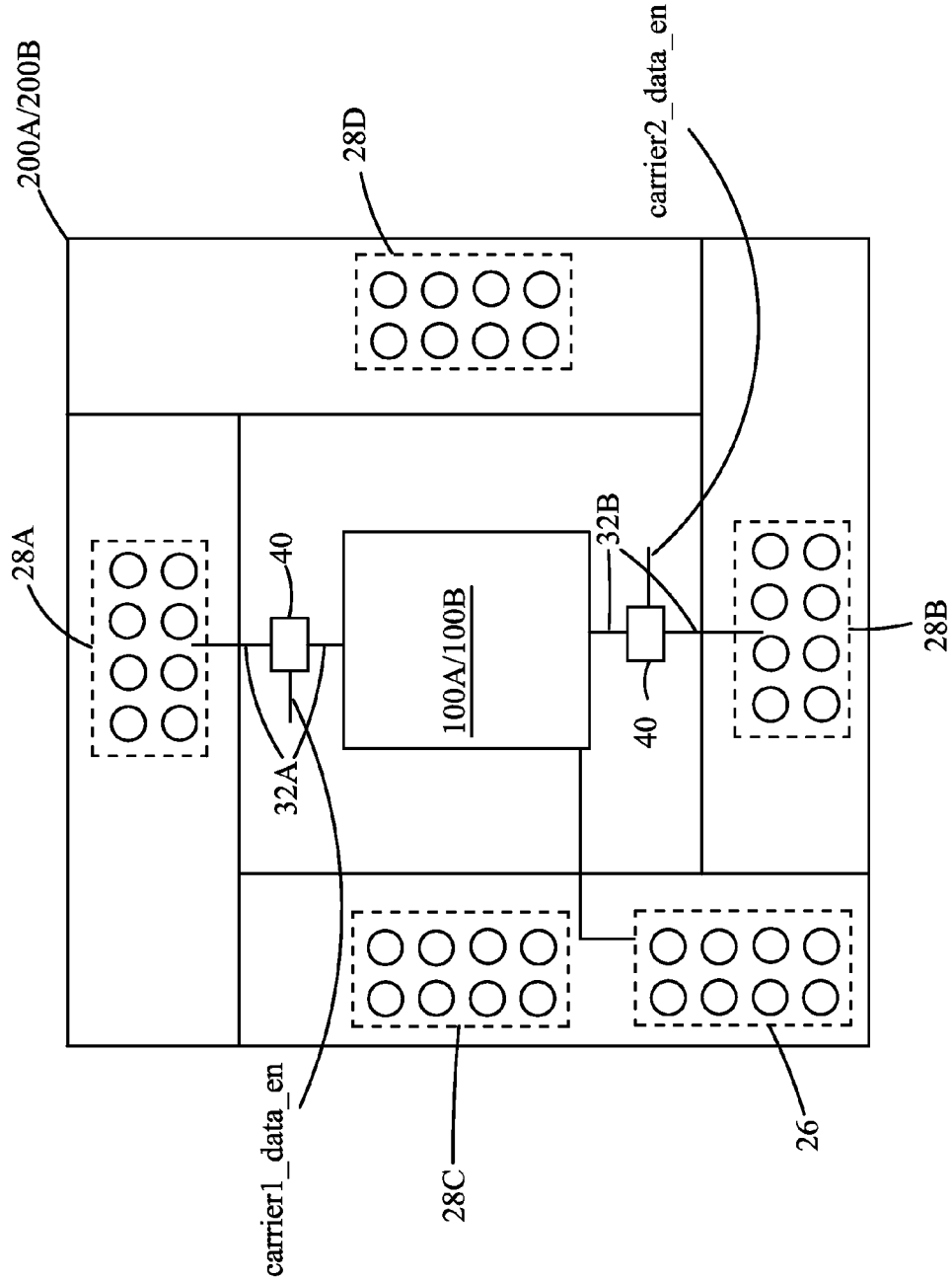
Figure 15:
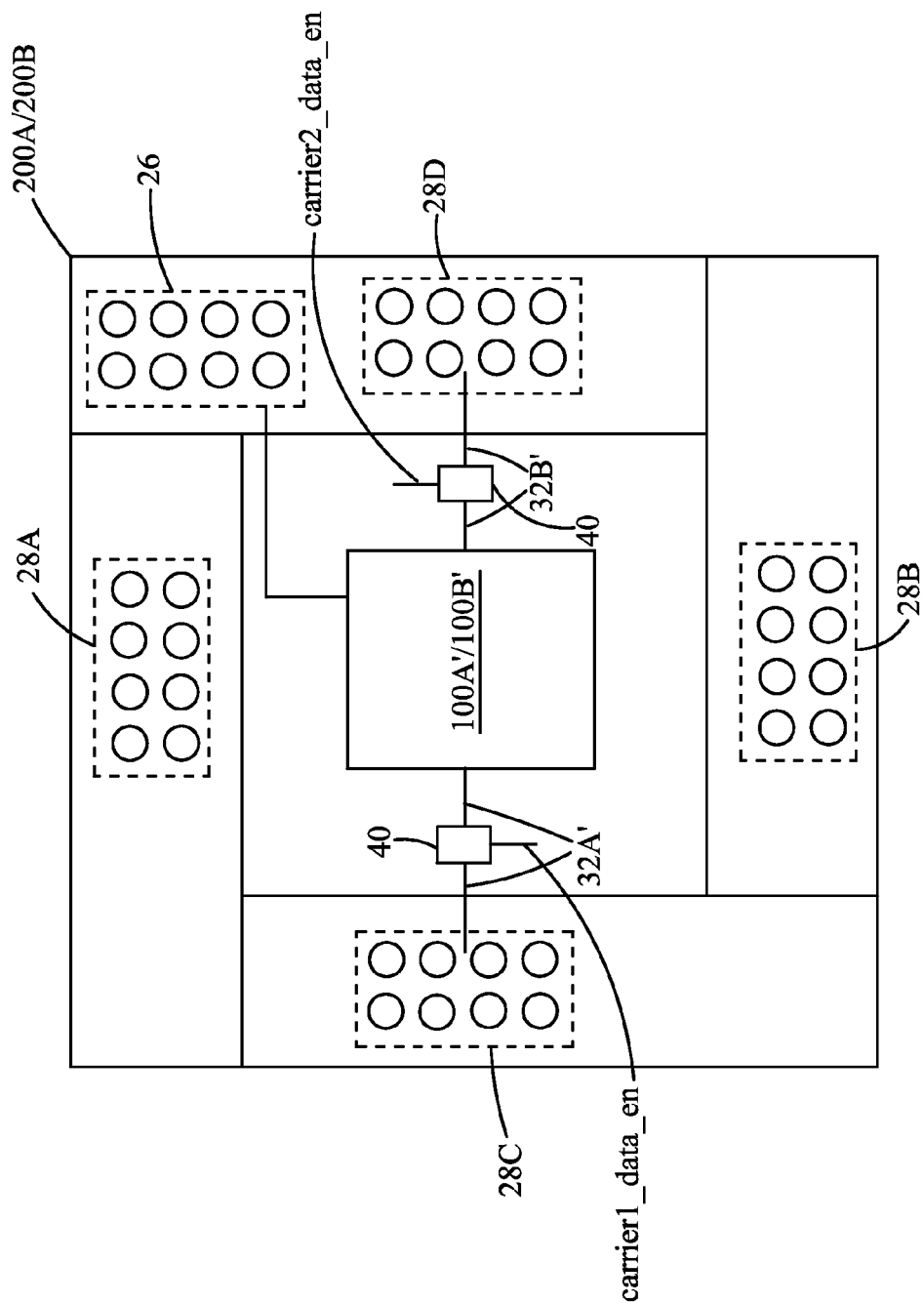

FIGS. 13 through 15 illustrate a package structure in accordance with yet other embodiments. FIG. 13 is a cross-sectional view, which shows that four device dies 100 (including 100A, 100A', 100B, and 100B') are stacked through die carriers 200 including 200A and 200B. Dies 100A and 100A' are bonded on the top side and the bottom side of die carrier 200A, respectively. Dies 100B and 100B' are bonded on the top side and the bottom side of die carrier 200B, respectively. In an embodiment, dies 100A and 100A are aligned. In alternative embodiments, dies 100A/100B and the respective dies 100A'/100B' (as shown using dashed lines) are misaligned.

Interposer 22 is bonded to the stacked dies 100 and die carriers 200. Data buses 28 may include four buses 28A through 28D, each dedicated to the data transmission of one of device dies 100A, 100A', 100B, and 100B'. Enablement signal generation circuits 46 (not shown, please refer to FIG. 5) may adopt the similar scheme as shown in FIGS. 4 and 5 to generate appropriate enablement signals carrier1_data_en and carrier2_data_en as shown in FIGS. 14 and 15. The enablement signals are provided to control transmission gates 40 in FIGS. 14 and 15. In this embodiment, since there are four dedicated data buses 28 (28A through 28D, FIGS. 14 and 15), the bandwidth is increased to four times the bandwidth of any one of data buses 28. Similarly, device dies 100A through 100 B' may be identical, and die carriers 200A and 200B may be identical.

FIG. 14 illustrates a top view of die carriers 200A and 200B and the respective device dies 100A and 100B. The electrical connections 32 on the top side of die carrier 200A and 200B now include two groups, namely 32A and 32B, which connect the respective device dies 100 to address/control lines 26, and to the respective data buses 28 (including 28A and 28B). Data enablement signals carrier1_data_en and carrier2_data_en are used to control the transmission of data to data buses 28, so that each of data buses 28A and 28B is dedicated to one of device dies 100A and 100B.

FIG. 15 illustrates a bottom view of die carriers 200A and 200B and the respective device dies 100A' and 100B'. The electrical connections 32 on the bottom side of die carrier 200A and 200B include two groups, namely 32A' and 32B', which connect the respective device dies 100 to address/control lines 26, and to the respective groups of data buses 28 (including 28C and 28D). Data enablement signals carrier1_data_en and carrier2_data_en are used to control the transmission of data to data buses 28, so that each of data buses 28C and 28D is dedicated to one of device dies 100A' and 100B'.

In each of the above-discussed embodiments, the stacking may be expanded by stacking more die carriers that are identical to die carrier 200A, and stacking more device dies that are identical to the device dies bonded to die carrier 200A. Since die carriers 200 are identical, device dies 100 are identical, and the respective connections 32 are also identical, there is no need to redesign the device dies and die carriers. Furthermore, since device dies have dedicated buses, the bandwidth of the resulting package structure is increased.

In accordance with embodiments, a package structure includes a plurality of die carriers identical to each other. The respective features in each of the plurality of die carriers vertically overlap corresponding features in other ones of the plurality of die carriers. Each of the plurality of die carriers includes a plurality of TSVs including a plurality of data buses. The plurality of die carriers is stacked and electrically connected to each other through the plurality of TSVs. The package structure further includes a plurality of device dies. Each of the plurality of device dies is bonded to one of the plurality of die carriers. Each of the plurality of data buses is configured to dedicate to data transmission of one of the plurality of device dies.

In accordance with other embodiments, a package structure includes an interposer including a first plurality of data buses; a plurality of device dies identical to each other; and a plurality of die carriers identical to each other and stacked on the interposer. Each of the plurality of device dies is bonded to one of the plurality of die carriers. Each of the plurality of die carriers includes a plurality of TSVs comprising a second plurality of data buses, wherein each of the second plurality of data buses is connected to one of the first plurality of data buses; and a plurality of electrical connections connecting a respective one of the plurality of device dies to the first and the second plurality of data buses.

In accordance with yet other embodiments, a package structure includes a first plurality of device dies and a second plurality of device dies identical to each other; and a plurality of die carriers identical to each other stacked together. Each of the first plurality of device dies is bonded to one of the plurality of die carriers. Each of the second plurality of device dies is bonded to one of the plurality of die carriers. Each of the plurality of die carriers comprises two device dies bonded thereon, and comprises a plurality of TSVs. The plurality of TSVs comprises a plurality of data buses. Each of the plurality of data buses is configured to dedicate to data transmission of one of the first and the second plurality of device dies. The plurality of TSVs further includes a plurality of address and control lines connected to the first and the second plurality of device dies.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package structure comprising:
   a plurality of data buses;
   a plurality of die carriers electrically connected to each other, and wherein each of the plurality of die carriers comprises:
      a plurality of electrical connection elements connecting adjacent die carriers;
      a portion of the plurality of data buses, wherein each of the plurality of data buses penetrates through each of the plurality die carriers; and
   a first plurality of device dies, wherein each of the first plurality of device dies is bonded to one of the plurality of die carriers, and wherein each of the plurality of data buses is configured to dedicate to data transmission of one of the first plurality of device dies.

2. The package structure of claim 1, wherein the first plurality of device dies is identical to each other.

3. The package structure of claim 1, wherein the plurality of device dies and the plurality of die carriers are stacked to form a stack, and each of the plurality of data buses extends from a top die carrier to a bottom die carrier in the stack.

4. The package structure of claim 1, wherein each of the plurality of die carriers comprises die carrier ID lines configured to receive a first carrier ID from an underlying die carrier, and configured to transfer a second ID different from the first ID to an overlying die carrier.

5. The package structure of claim 4 further comprising:
   a plurality of enablement signal generation circuits configured to generate enablement signals using signals on the die carrier ID lines as inputs; and
   a plurality of transmission gates, each connecting one of the plurality of device dies to one of the plurality of data buses, wherein an output of each of the plurality of enablement signal generation circuits controls one of the plurality of transmission gates.

6. The package structure of claim 1 further comprising an interposer stacked with the plurality of die carriers, wherein the interposer comprises a plurality of data buses, and wherein each of the plurality of data buses in the plurality of die carriers is electrically connected to one of the plurality of data buses in the interposer.

7. The package structure of claim 6 further comprising:
   an additional device die identical to the first plurality of device dies, wherein the additional device die is bonded to the interposer; and
   an additional bus connecting the additional device die to one of the plurality of data buses in the interposer.

8. The package structure of claim 1 further comprising a plurality of address lines and control lines electrically connected to the plurality of device dies through a plurality of TSVs in the plurality of die carriers.

9. The package structure of claim 1 further comprising a second plurality of device dies, wherein each of the second plurality of device dies is bonded to one of the plurality of die carriers.

10. The package structure of claim 9, wherein one of the first plurality of device dies and one of the second plurality of device dies are bonded to a same side of a respective one of the plurality of die carriers.

11. The package structure of claim 9, wherein one of the first plurality of device dies and one of the second plurality of device dies are bonded to opposite sides of a respective one of the plurality of die carriers.

12. A package structure comprising:
   a plurality of data buses;
   an interposer electrically connected to the plurality of data buses;
   a first plurality of device dies identical to each other; and
   a plurality of die carriers stacked on the interposer and electrically connected to each other to form a stack, wherein each of the first plurality of device dies is bonded to one of the plurality of die carriers or the interposer, wherein each of the plurality of data buses extends from a top one to a bottom one of the die carriers in the stack, and to the interposer, and is configured to dedicate to data transmission of one of the first plurality of device dies, and wherein each of the plurality of die carriers comprises a plurality of electrical connection elements interconnecting adjacent ones of the interposer and plurality of die carriers.

13. The package structure of claim 12, wherein each of the plurality of die carriers comprises carrier ID lines configured to receive a first carrier ID from an underlying die carrier, and to transfer a second ID different from the first ID to an overlying die carrier.

14. The package structure of claim 13 further comprising:
   a plurality of enablement signal generation circuits configured to generate enablement signals using signals on the carrier ID lines as inputs; and
   a plurality of transmission gates, each connecting one of the first plurality of device dies to one of the plurality of data buses, wherein an output of each of the enablement signal generation circuits is configured to control one of the plurality of transmission gates.

15. A package structure comprising:
- a plurality of device dies identical to each other;
- an interposer; and
- a plurality of die carriers stacked together, wherein a first one and a second one of the plurality of device dies are bonded to two of the plurality of die carriers and the interposer, and wherein each of the plurality of die carriers comprises:
  - a plurality of electrical connection element interconnecting adjacent ones of the interposer and the plurality of die carriers;
  - a plurality of data buses, wherein each of the plurality of data buses is configured to dedicate to data transmission of one of the plurality of device dies; and
  - die carrier ID lines configured to receive a first carrier ID from an underlying die carrier, and configured to transfer a second carrier ID different from the first carrier ID to an overlying die carrier.

16. The package structure of claim 15, wherein the first one and the second one of the plurality of device dies are bonded to a same side of a respective one of the plurality of die carriers.

17. The package structure of claim 15, wherein the first one and the second one of the plurality of device dies are bonded to opposite sides of a respective one of the plurality of die carriers.

18. The package structure of claim 15, wherein the interposer is stacked with the plurality of die carriers, wherein the interposer comprises a plurality of data buses, and wherein each of the plurality of data buses in the plurality of die carriers is electrically connected to one of the plurality of data buses in the interposer.

19. The package structure of claim 15 further comprising:
- a plurality of enablement signal generation circuits configured to generate enablement signals using signals on the die carrier ID lines as inputs; and
- a plurality of transmission gates, each connecting one of the plurality of device dies to one of the plurality of data buses, wherein an output of each of the enablement signal generation circuits is configured to control one of the plurality of transmission gates.

20. The package structure of claim 15, wherein each of the die carrier ID lines penetrates through each of the plurality of die carriers.

* * * * *